United States Patent
Makita et al.

(10) Patent No.: US 9,030,252 B2
(45) Date of Patent: May 12, 2015

(54) HIGH FREQUENCY SWITCHING DEVICE, AND BIAS VOLTAGE OUTPUTTING DEVICE

(75) Inventors: Minoru Makita, Hyogo (JP); Yuji Ikeda, Hyogo (JP)

(73) Assignee: Imagineering, Inc., Kyogo (JP)

( * ) Notice: Subject to any disclaimer, the term of this patent is extended or adjusted under 35 U.S.C. 154(b) by 0 days.

(21) Appl. No.: 14/119,631

(22) PCT Filed: May 23, 2012

(86) PCT No.: PCT/JP2012/063222
§ 371 (c)(1),
(2), (4) Date: Mar. 18, 2014

(87) PCT Pub. No.: WO2012/161228
PCT Pub. Date: Nov. 29, 2012

(65) Prior Publication Data
US 2014/0184302 A1    Jul. 3, 2014

(30) Foreign Application Priority Data
May 24, 2011    (JP) .................................. 2011-115293

(51) Int. Cl.
*H03K 17/04*    (2006.01)
*H01P 5/12*    (2006.01)
(Continued)

(52) U.S. Cl.
CPC *H03K 17/04* (2013.01); *H01P 5/16* (2013.01); *H03K 17/76* (2013.01)

(58) Field of Classification Search
USPC ................. 327/374, 385, 365, 403, 415, 493, 327/108–112; 326/82, 83, 17; 333/100, 333/101, 103; 455/78, 80, 82
See application file for complete search history.

(56) References Cited

U.S. PATENT DOCUMENTS 4,220,874 A * 9/1980 Iwata et al. .................... 327/493
5,193,218 A * 3/1993 Shimo .............................. 455/80
(Continued)

FOREIGN PATENT DOCUMENTS

| JP | 51-77719 A | 7/1976 |
| JP | 61-189602 U | 11/1986 |
| JP | 63-173417 A | 7/1988 |

(Continued)

OTHER PUBLICATIONS

International Search Report dated Sep. 18, 2012, issued in corresponding application No. PCT/JP2012/063222.

*Primary Examiner* — Lincoln Donovan
*Assistant Examiner* — Thomas Skibinski
(74) *Attorney, Agent, or Firm* — Westerman, Hattori, Daniels & Adrian, LLP

(57) ABSTRACT

A high frequency switch device includes a branch transmission line corresponding to each output terminal provided with a switching part. In the branch transmission line, the switching part includes a transmission side diode provided in such a manner that a cathode thereof is arranged on a side of an input terminal 41 and an anode thereof is arranged on a side of the output terminal, and a ground side diode provided in such a manner that a cathode thereof is grounded and an anode thereof is electrically connected between the output terminal and the transmission side diode in the branch transmission line. The branch transmission line includes a first capacitor and a second capacitor on the side of the output terminal from the transmission side diode in such a manner that the anode of the ground side diode is connected between the first capacitor and the second capacitor.

6 Claims, 6 Drawing Sheets

(51) Int. Cl.
*H01P 5/16* (2006.01)
*H03K 17/76* (2006.01)

(56) References Cited

U.S. PATENT DOCUMENTS 6,542,021 B2 * 4/2003 Isono et al. .................. 327/365

7,129,805 B2 * 10/2006 Marion et al. ................ 333/103

FOREIGN PATENT DOCUMENTS

| JP | 02-142217 A | 5/1990 |
| JP | 07-074672 A | 3/1995 |

\* cited by examiner

HIGH FREQUENCY SWITCHING DEVICE, AND BIAS VOLTAGE OUTPUTTING DEVICE

TECHNICAL FIELD

The present invention relates to a high frequency switch device that switches an output terminal, from which high frequency is outputted, from among a plurality of output terminals and a bias voltage output device that outputs a bias voltage to a diode of the high frequency switch device.

BACKGROUND ART

Conventionally, there is known a high frequency switch device that switches an output terminal, from which high frequency is outputted, from among a plurality of output terminals. This type of a high frequency switch device is applicable to a multi-cylinder engine that utilizes microwave energy in combustion chambers, for example. The high frequency switch device allows one electromagnetic wave oscillator to provide microwaves to a plurality of the combustion chambers one after another.

For example, FIG. 8 of Japanese Unexamined Patent Application, Publication No. 1976-77719 discloses a distributer (a high frequency switch device) that switches a supply destination of microwave from among four cylinders. The distributer performs the switching by rotating a rotor. Also, for example, Japanese Unexamined Patent Application, Publication No. 1995-74672 discloses a high frequency switch that employs diodes so as to switch a connection destination of an antenna between a transmission circuit and a receiving circuit.

THE DISCLOSURE OF THE INVENTION

Problems to be Solved by the Invention

In a conventional high frequency switch device, a mechanical switching unit is employed to switch an output terminal from which high frequency is outputted. However, an electrical loss can cause at a contact point of the switch because it is difficult for a mechanical switch to perform a high speed switching.

The present invention has been made in view of above described drawback. It is an object of the present invention to allow a high frequency switch device, that switches an output terminal outputting a high frequency from among a plurality of output terminals, to switch the output terminal outputting the high frequency with high speed and low loss.

Means for Solving the Problems

In accordance with a first aspect of the present invention, there is provided a high frequency switch device including: an input terminal that inputs a high frequency from outside; a plurality of output terminals that output to outside the high frequency inputted to the input terminal; a plurality of branch transmission lines that are respectively provided to the output terminals and are each adapted to transmit to the corresponding output terminal the high frequency inputted to the input terminal; and a plurality of switching units that are respectively provided to the branch transmission lines, and are each adapted to switch between an ON state which allows a high frequency to flow through the corresponding branch transmission line, and an OFF state which does not allow a high frequency to flow through the corresponding branch transmission line. The high frequency switch device controls the switching units so as to switch the output terminal, from which high frequency is outputted. Each switching unit includes: a transmission side diode that is provided in the branch transmission line in such a manner that a cathode thereof is arranged on a side of the input terminal and an anode thereof is arranged on a side of the output terminal; and a ground side diode that is provided in such a manner that a cathode thereof is grounded and an anode thereof is electrically connected between the output terminal and the transmission side diode in the branch transmission line. Each branch transmission line includes a first capacitor and a second capacitor on the side of the output terminal from the transmission side diode in such a manner that the anode of the ground side diode is connected between the first capacitor and the second capacitor.

According to the first aspect of the present invention, the output terminal, from which high frequency is outputted, is switched from among the plurality of output terminals when the switching units are controlled. Each switching unit includes the transmission side diode and the ground side diode. The transmission side diode is provided in the branch transmission line in such a manner that the cathode thereof is arranged on the side of the input terminal and the anode thereof is arranged on the side of the output terminal. On the other hand, the ground side diode is provided in such a manner that the cathode thereof is grounded and the anode thereof is connected between the output terminal and the transmission side diode in the branch transmission line. In the high frequency switch device, a forward bias is applied to the transmission side diode and a reverse bias is applied to the ground side diode with regard to the branch transmission line (hereinafter, referred to as "output side transmission line") connected to the output terminal, from which high frequency is outputted. On the other hand, the reverse bias is applied to the transmission side diode and the forward bias is applied to the ground side diode with regard to the branch transmission line (hereinafter, referred to as "non-output side transmission line") connected to the output terminal, from which high frequency is not supposed to be outputted. In each branch transmission line, two capacitors are connected in such a manner that the anode of the ground diode is connected between the two capacitors. Accordingly, it is possible to apply voltages reverse in polarity to each other to the transmission side diode and the ground side diode, respectively.

In a case in which the ground side diode is not provided, even if the reverse bias is applied to the transmission side diode of the non-output side transmission line, a high frequency passes through a parasitic capacitance of the transmission side diode to some extent. As a result of this, a high frequency is outputted, to some extent, through the output terminal of the non-output side transmission line, which is not supposed to output a high frequency. While, on the other hand, according to the first aspect of the present invention, in the non-output side transmission line, the forward bias is applied to the ground side diode so as to ground the side of the output terminal apart from the parasitic capacitance in the non-output side transmission line. Accordingly, the impedance of the side of the output terminal from the parasitic capacitance increases, and as a result thereof, the high frequency outputted from the output terminal of the non-output side transmission line is decreased.

In accordance with a second aspect of the present invention, in addition to the first aspect of the present invention, the cathode of the ground side diode is grounded at a location distant from the transmission side diode by approximately $(2n+1) \times \lambda/4$, wherein $\lambda$ is defined as a wavelength of the high frequency flowing through the high frequency switching device and n is defined as a non-negative integer.

According to the second aspect of the present invention, the cathode of the ground side diode is grounded at the location distant from the transmission side diode by approximately $(2n+1)\times\lambda/4$. Accordingly, when the ground side diode is made conductive, the impedance of the side of the output terminal viewed from the parasitic capacitance in the non-output side transmission line becomes infinite. Consequently, the non-output side transmission line becomes equivalent to being disconnected from the input terminal and does not affect the output side transmission line any more.

In accordance with a third aspect of the present invention, in addition to the first or the second aspect of the present invention, there are provided a transmission side bias line for applying a bias voltage to the transmission side diode and a ground side bias line for applying a bias voltage to the ground side diode. The transmission side bias line and the ground side bias line are small in current carrying area (cross sectional area of a conductor along a plane perpendicular to a current flowing direction) in comparison with the branch transmission line.

According to the third aspect of the present invention, the transmission side bias line and the ground side bias line are small in current carrying area in comparison with the branch transmission line.

In accordance with a fourth aspect of the present invention, in addition to the third aspect of the present invention, in which the transmission side bias line and the ground side bias line are each grounded at a location distant from the branch transmission line by approximately $(2n+1)\times\lambda/4$ wherein $\lambda$ is defined as a wavelength of the high frequency flowing through the high frequency switching device and n is defined as a non-negative integer.

According to the fourth aspect of the present invention, the bias lines are grounded at respective locations distant from the branch transmission line by approximately $(2n+1)\times\lambda/4$.

In accordance with a fifth aspect of the present invention, in addition to any one of the first to fourth aspects of the present invention, each branch transmission line is provided with a plurality of the ground side diodes, which are connected in series between the branch transmission line and a ground conductor which the cathode of one of the ground side diodes is connected to.

According to the fifth aspect of the present invention, the plurality of ground side diodes are connected in series between the branch transmission line and the ground conductor. There has been concern that a high frequency potential increases at a location where the ground side diode is connected to the branch transmission line by high frequency reflection due to impedance mismatch. Ina case in which a high frequency of relatively high power is transmitted, since a high reverse voltage is exerted on the ground side diode by high frequency reflection, there has been concern that the ground side diode is damaged. While on the other hand, according to the fifth aspect of the present invention, since the plurality of ground side diodes are connected in series, a reverse withstand voltage of the overall ground side diodes is increased.

In accordance with a sixth aspect of the present invention, in addition to any one of the first to fifth aspects of the present invention, there is provided an input side ground line for grounding the input terminal. The input side ground line branches into a plurality of branch ground lines which are different in electrical length from one another and are respectively grounded.

According to the sixth aspect of the present invention, the input side ground line is provided with the plurality of branch ground lines which are different in electrical length from one another. Accordingly, even after the high frequency switch device is completed, it is possible to adjust the electrical length of the input side ground line by, for example, removing a branch ground line of a shortest path.

In accordance with a seventh aspect of the present invention, in addition to any one of the first to sixth aspects of the present invention, there is provided a bias voltage output device that outputs bias voltages respectively to the transmission side diodes and the ground side diodes of the high frequency switch device, wherein the bias voltage output device is connected to a power supply and adapted selectively to step down a voltage applied from the power supply and output the voltage thus stepped down to diodes that are to be applied with the forward bias from among the transmission diodes and the ground side diodes, and to boost the voltage applied from the power supply and output the voltage thus boosted as a bias voltage to diodes that are to be applied with the reverse bias from among the transmission diodes and the ground side diodes.

According to the seventh aspect of the present invention, the bias voltage output device steps down the voltage applied from the power supply so as to output it as a bias voltage to the diodes to be applied with the forward bias, and boosts the voltage applied from the power supply so as to output it as a bias voltage to the diodes to be applied with the reverse bias. For example, in a case in which the high frequency switch device is applied to a vehicle equipped with a plasma combustion engine, the bias voltage may be generated from a battery (of 12 V, for example) of the vehicle. In this case, diodes in general can be suitably controlled by setting the bias voltage lower than the vehicle battery voltage in the case of forward bias and setting the bias voltage higher than the vehicle battery voltage in the case of reverse bias. According to the seventh aspect of the present invention, based on the above described technical idea, the voltage applied from the power supply is stepped down or boosted and then outputted as bias voltages.

Effect of the Invention

According to the present invention, since the impedance of the side of the output terminal viewed from the parasitic capacitance in the non-output side transmission line is increased by making the ground side diode of the non-output side transmission line conductive, the high frequency outputted from the output terminal of the non-output side transmission line is decreased. Accordingly, even if diodes are employed to switch the output terminal, from which high frequency is outputted, at high speed, it is possible to transmit a large amount of high frequency energy to the output terminal of the output side transmission line. According to the present invention, it is possible to switch the output terminal, from which high frequency is outputted, at high speed and with low loss.

Furthermore, according to the second aspect of the present invention, a distance between the transmission side diode and the grounding point is optimized so that the non-output side transmission line should not affect the output side transmission line. As a result of this, since the impedance of the output side transmission line alone constitutes the impedance viewed from the input terminal, it is easy to attain impedance matching. Accordingly, it is possible to transmit a larger amount of high frequency energy to the output terminal, from which high frequency is outputted, and to perform switching of the output terminal, from which high frequency is outputted, with lower loss.

Furthermore, according to the third aspect of the present invention, the transmission side bias line and the ground side bias line are designed to be small in current carrying area in comparison with the branch transmission line so that a high frequency impedance of each bias line viewed from the input terminal should be high. Accordingly, since each bias line less affects the high frequency transmission in the branch transmission line, it is possible to perform switching of the output terminal, from which high frequency is outputted, with lower loss.

Furthermore, according to the fourth aspect of the present invention, each bias line is grounded at a location distant from the branch transmission line by approximately $(2n+1)\times\lambda/4$ so that the high frequency impedance of each bias line viewed from the input terminal should be high. Accordingly, each bias line less affect the high frequency transmission in the branch transmission line, and it is possible to perform the switching of the output terminal, from which high frequency is outputted, with lower loss.

Furthermore, according to the fifth aspect of the present invention, the plurality of ground side diodes are connected in series so that the reverse withstand voltage of the overall ground side diodes should be increased. Accordingly, it is possible to prevent the ground side diodes from being damaged by the reflection of high frequency due to impedance mismatch.

Furthermore, according to the sixth aspect of the present invention, the input side ground line is provided with the plurality of branch ground lines different in electrical length from one another so that the electrical length of the input side ground line can be adjusted even after the high frequency switch device is completed. Accordingly, it is possible to individually adjust the impedance of the high frequency switch device in accordance with variation in circuit impedance due to variation in assembly and constituent parts of the high frequency switch device. Therefore, it is possible to optimize the impedance matching while the high frequency switch device in a state of use, being connected to other devices such as an electromagnetic wave oscillator and an antenna.

Furthermore, according to the seventh aspect of the present invention, since the voltage applied from the power supply is stepped down or boosted, and then, outputted as a bias voltage according to an application direction of the bias voltage, it is possible to suitably control each diode.

BEST MODE FOR CARRYING OUT THE INVENTION

Figure 1:
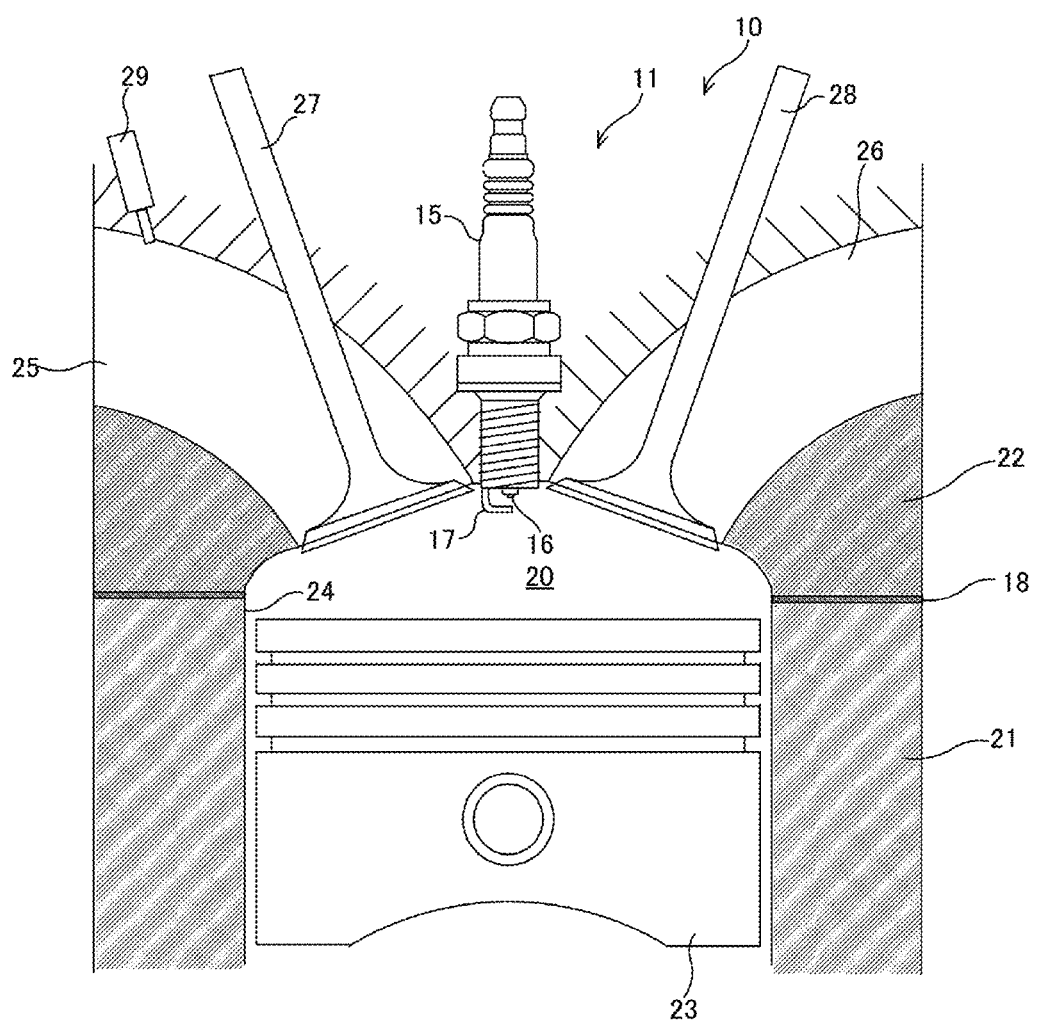
FIG. 1 is a schematic configuration diagram of an internal combustion engine according to an embodiment.

In the following, a detailed description will be given of embodiments of the present invention with reference to drawings. It should be noted that the following embodiments are merely preferable examples, and do not limit the scope of the present invention, applied field thereof, or application thereof.

Embodiment

The present embodiment is directed to a multi cylinder engine 10 provided with an electromagnetic wave emission device 13 including a high frequency switch device 33 according to the present invention. The electromagnetic wave emission device 13 constitutes a part of a plasma generation device 30 that generates microwave plasma by emitting a microwave to a combustion chamber 20 of each cylinder 24. The engine 10 includes an engine main body 11 and the plasma generation device 30.

<Engine Main Body>

As shown in FIG. 1, the engine main body 11 is provided with a cylinder block 21, a cylinder head 22, and pistons 23. The cylinder block 21 is formed with a plurality of the cylinders 24 each having a circular cross section. Inside of each cylinder 24, the piston 23 is reciprocatably fitted. The piston 23 is connected to a crankshaft (not shown) via a connecting rod (not shown). The crankshaft is rotatably supported by the cylinder block 21.

The cylinder head 22 is placed on the cylinder block 21, and a gasket 18 intervenes between the cylinder block 21 and the cylinder head 22. The cylinder head 22 partitions the combustion chamber 20 along with the cylinder 24 and the piston 23. The cylinder head 22 is provided with one ignition plug 15 for each cylinder 24. The cylinder head 22 is formed with an intake port 25 and an exhaust port 26 for each cylinder 24. The intake port 25 is provided with an intake valve 27 and an injector 29. On the other hand, the exhaust port 26 is provided with an exhaust valve 28.

<Plasma Generation Device>

Figure 2:
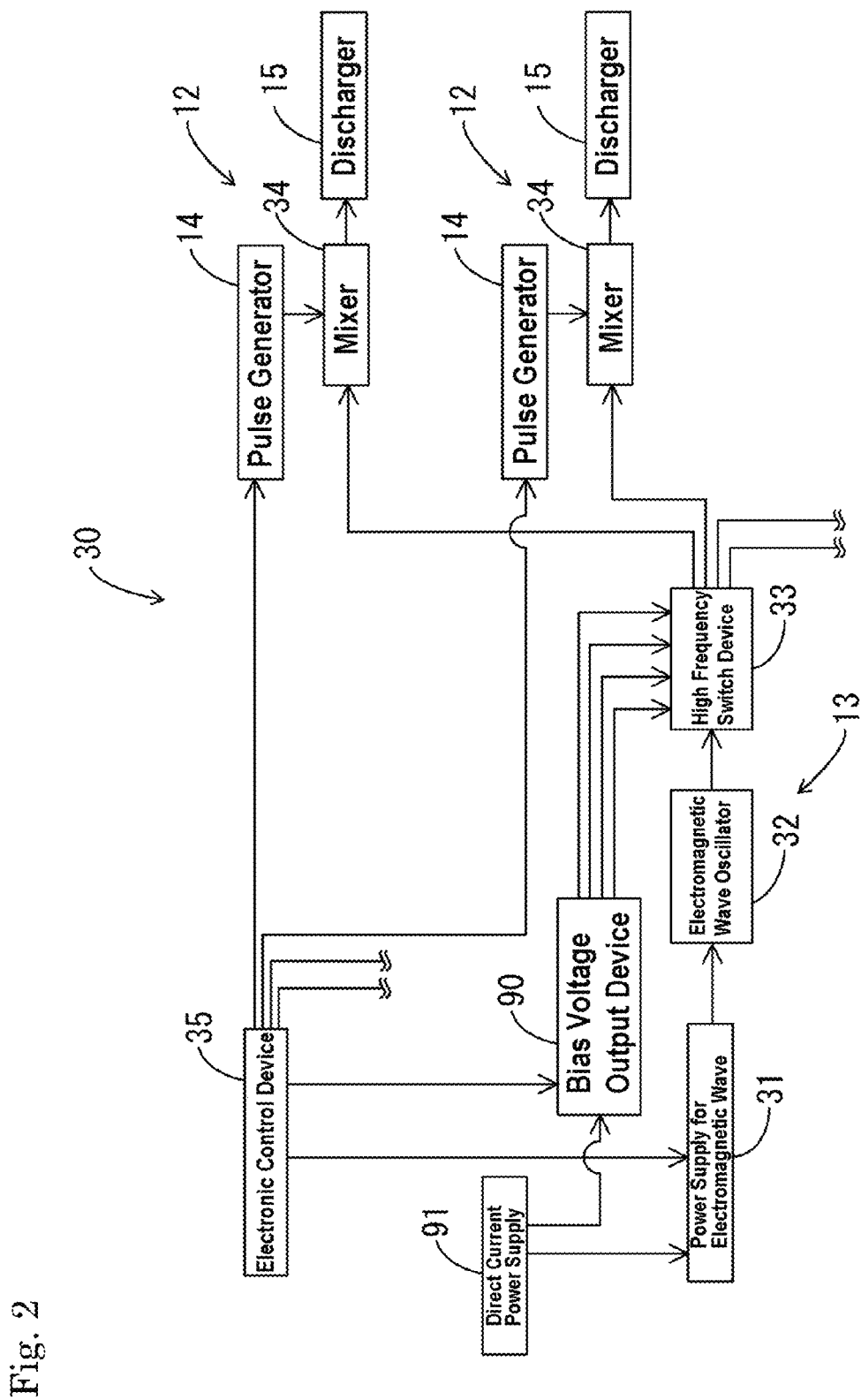
FIG. 2 is a block diagram of a plasma generation device according to the embodiment.

As shown in FIG. 2, the plasma generation device 30 is provided with a discharge device 12, and the electromagnetic wave emission device 13. The plasma generation device 30 supplies energy of the microwave emitted by the electromagnetic wave emission device 13 to discharge plasma generated by the discharge device 12 so as to expand the discharge plasma, thereby generating microwave plasma.

The discharge device 12 is provided for each combustion chamber 20. The discharge device 12 includes a pulse generator 14 that outputs a high voltage pulse, and a discharger 15 that causes discharge when the high voltage pulse is applied from the pulse generator 14.

The pulse generator 14 is, for example, an ignition coil for a vehicle. The pulse generator 14 is connected to a direct current power supply 91 such as a vehicle battery (not shown). The pulse generator 14, upon receiving an ignition signal from an electronic control device 35, boosts a voltage applied from the direct current power supply 91, and outputs the boosted high voltage pulse to the discharger 15.

The discharger 15 is, for example, an ignition plug for a vehicle. The ignition plug 15 is supplied with the high voltage pulse via a mixer 34, which will be described later. In the ignition plug 15, when the high voltage pulse is supplied, insulation breakdown is caused at a discharge gap between a central electrode 16 and a ground electrode 17 so that the discharge plasma (spark discharge) is generated.

The electromagnetic wave emission device 13 is provided with a power supply for electromagnetic wave 31, an electromagnetic wave oscillator 32, the high frequency switch device 33, the mixer 34, and an emission antenna 16. In the present embodiment, the central electrode 16 of the ignition plug 15 also serves as the emission antenna 16. For each electromagnetic wave emission device 13, one power supply for electromagnetic wave 31, one electromagnetic wave oscillator 32, and one high frequency switch device 33 are provided. Similarly, for each combustion chamber 20, the mixer 34 and the emission antenna 16 are provided.

The power supply for electromagnetic wave 31 is connected to the direct current power supply 91. The power supply for electromagnetic wave 31, upon receiving an electromagnetic wave drive signal from the electronic control device 35, supplies a pulse current to the electromagnetic wave oscillator 32. The electromagnetic wave drive signal is a pulse signal such as a TTL (Transistor-Transistor Logic) signal. The power supply for electromagnetic wave 31 repeatedly outputs the pulse current at a predetermined duty cycle during a period from a rising time point until a falling time point of the electromagnetic wave drive signal. The pulse current is repeatedly outputted during the period of a pulse width of the electromagnetic wave drive signal.

The electromagnetic wave oscillator 32 is, for example, a magnetron. The electromagnetic wave oscillator 32, upon receiving the pulse current, outputs a microwave pulse. The electromagnetic wave oscillator 32 repeatedly outputs the microwave pulse during the period of the pulse width of the electromagnetic wave drive signal. In place of the magnetron, other oscillators such as a semiconductor oscillator may be employed as the electromagnetic wave oscillator 32.

The high frequency switch device 33 switches, from among the plurality of emission antennae 16, the antenna to be supplied with the microwave outputted from the electromagnetic wave oscillator 32. The high frequency switch device 33 is controlled by the electronic control device 35. A detailed description of the high frequency switch device 33 will be given later.

The mixer 34 receives the high voltage pulse from the pulse generator 14 and the microwave from the electromagnetic wave oscillator 32 via different input terminals, and outputs the high voltage pulse and the microwave to the ignition plug 15 via the same output terminal. The mixer 34 is configured to be able to mix the high voltage pulse and the microwave. In the mixer 34, a first input terminal is electrically connected to the pulse generator 14, a second input terminal is electrically connected to the high frequency switch device 33, and an output terminal is electrically connected to the emission antenna 16.

<Configuration of High Frequency Switch Device>

Figure 3:
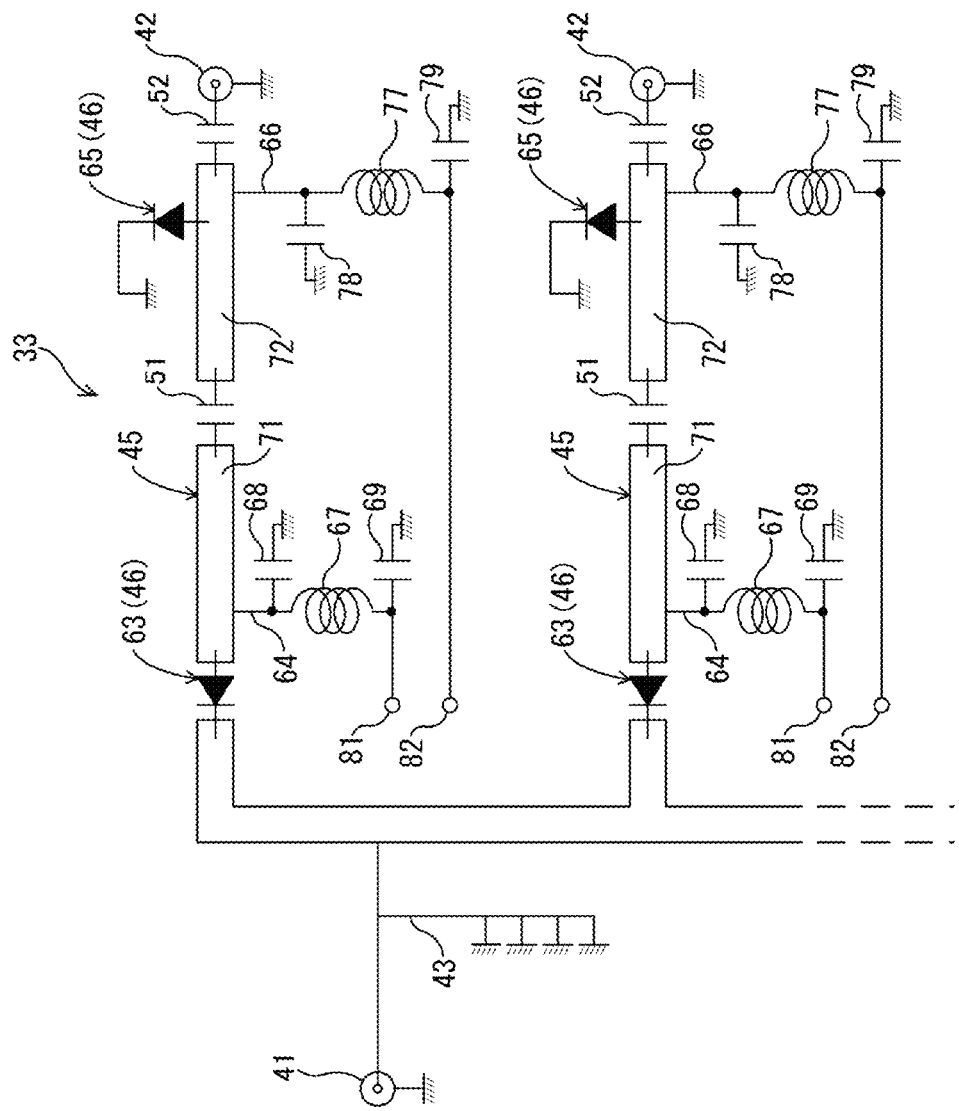
FIG. 3 is a schematic configuration diagram of a high frequency switch device according to the embodiment.
Figure 4:
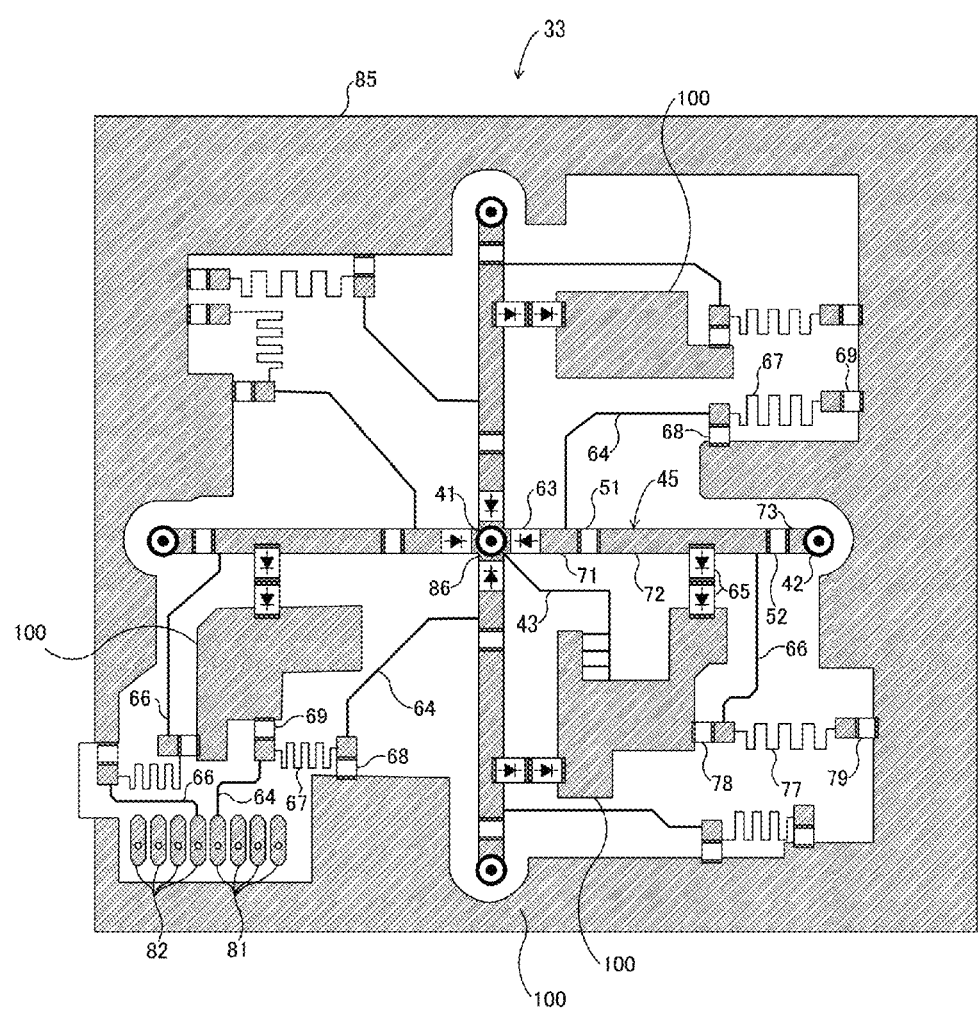
FIG. 4 is a top view of a circuit board provided with the high frequency switch device according to the embodiment.

As shown in FIGS. 3 and 4, the high frequency switch device 33 is provided with an input terminal 41, a plurality of output terminals 42, and a plurality of branch transmission lines 45. The input terminal 41 is electrically connected to an output side of the electromagnetic wave oscillator 32 and adapted to input a microwave outputted from the electromagnetic wave oscillator 32. Each output terminal 42 is electrically connected to an input side of the mixer 34. From each output terminal 42, the microwave inputted in the input terminal 41 is outputted to the mixer 34. The branch transmission lines 45 are provided respectively corresponding to the output terminals 42. The plurality of branch transmission lines 45 are connected to one another at input sides thereof and respectively connected to the corresponding output terminals 42 at output sides thereof. The input terminal 41 is grounded via an input side ground line 43.

Each branch transmission line 45 is provided with a switching part (a switching unit) 46 that switches between an ON state, which allows a microwave to flow and an OFF state, which does not allow a microwave to flow. Each switching unit 46 includes a transmission side diode 63 and a ground side diode 65. Although both the transmission side diode 63 and the ground side diode 65 are PIN diodes, other types of diodes may be employed. Each branch transmission line 45 is provided with a first capacitor 51 and a second capacitor 52 respectively in order from a side of the input terminal 41.

Each transmission side diode 63 is mounted to the corresponding branch transmission line 45 in such a manner that a cathode thereof is arranged on the side of the input terminal 41 and an anode thereof is arranged on a side of the output terminal 42. Each transmission side diode 63 is mounted on the side of the input terminal 41 closer to the input terminal 41 than the first capacitor 51. The high frequency switch device 33 is provided with a transmission side bias line 64 corresponding to each transmission side diode 63. Each transmission side bias line 64 is an electrical line adapted to apply a bias voltage to the transmission side diode 63. Each transmission side bias line 64 is connected at one end thereof to a first signal input part 81 and at the other end thereof to a first strip line 71 between the transmission side diode 63 and the first capacitor 51 in the branch transmission line 45.

The ground side diode 65 is grounded at a cathode thereof and is electrically connected at an anode thereof between the output terminal 42 and the transmission side diode 63 in the branch transmission line 45. The anode of the ground side diode 65 is connected to a second strip line 72 between the first capacitor 51 and the second capacitor 52. The high frequency switch device 33 is provided with a ground side bias line 66 corresponding to each ground side diode 65. Each ground side bias line 66 is an electrical line adapted to apply a bias voltage to the ground side diode 65. Each ground side bias line 66 is connected at one end thereof to a second signal input part 82 and at the other end thereof to a second strip line 72.

The first signal input part 81 and the second signal input part 82 are provided for each branch transmission line 45. The first signal input part 81 and the second signal input part 82 receive the bias voltages outputted from a bias voltage output device 90, which will be described later.

Each transmission side bias line 64 is provided with an inductor 67. In each transmission side bias line 64, the inductor 67 is grounded at both sides respectively via capacitors 68 and 69.

Each ground side bias line 66 is provided with an inductor 77. In each ground side bias line 66, the inductor 77 is grounded at both sides respectively via capacitors 78 and 79.

FIG. 4 shows a top surface (a front surface) of the high frequency switch device 33 configured on a double layer printed circuit board (hereinafter, referred to as a "Printed circuit board 85"). A rear surface of the Printed circuit board 85 is formed with a ground pattern.

In the Printed circuit board 85, the input terminal 41 is arranged at a central part, and four branch transmission lines 45 are extending radially and equiangularly from the input terminal 41. On each branch transmission line 45, the transmission side diode 63, the first capacitor 51, and the second capacitor 52 are arranged in order from the side of the input terminal 41. The first strip line 71 is formed between the transmission side diode 63 and the first capacitor 51, the second strip line 72 is formed between the first capacitor 51 and the second capacitor 52, and a third strip line 73 is formed between the second capacitor 52 and the output terminal 42.

Each transmission side diode 63 is connected at the cathode thereof to a land 86 (a copper foil area) surrounding the input terminal 41 and at the anode thereof to an inner end of the first strip line 71. The land 86 is grounded to a ground pattern 100 (a ground conductor) via the input side ground line 43. The input side ground line 43 connects the cathode of the transmission side diode 63 to ground to have direct current components thereof flow therethrough. The line width of the input side ground line 43 is greatly narrower than those of the first to third strip lines 71 to 73. The current carrying area of the input side ground line 43 is greatly smaller than those of the first to third strip lines 71 to 73.

The transmission side diode 63, the first capacitor 51, and the second capacitor 52 are equal in electrode width to the strip lines 71 to 73. As a result of this, impedance mismatch due to difference in physical size is reduced at connection points of the strip lines 71 to 73 with the transmission side diode 63, the first capacitor 51, and the second capacitor 52. In the Printed circuit board 85, thickness and quality of board insulation material are selected so that the characteristic impedances of the strip lines 71 to 73 should match the microwave.

Between the second strip line 72 of each branch transmission line 45 and the ground pattern 100, two ground side diodes 65 are connected in series. One ground side diode 65 is connected to the second strip line 72 at an anode thereof, and the other ground side diode 65 is connected to the ground pattern 100 at a cathode thereof.

The transmission side bias line 64 is connected to the first strip line 71 of each branch transmission line 45. Each transmission side bias line 64 is provided with the inductor 67. In each transmission side bias line 64, the inductor 67 is grounded at both sides respectively via the capacitors 68 and 69. The capacitors 68 and 69 may be omitted and the transmission side bias line 64 may be directly grounded. In FIG. 4, electrical lines connecting the inductors 67 and the first signal input parts 81 are partially omitted.

Also, the ground side bias line 66 is connected to the second strip line 72. Each ground side bias line 66 is provided with the inductor 77. In each ground side bias line 66, the inductor 77 is grounded at both sides respectively via the capacitors 78 and 79. The capacitors 78 and 79 may be omitted and the ground side bias line 66 may be directly grounded. In FIG. 4, electrical lines connecting the inductors 77 and the second signal input parts 82 are partially omitted.

The line widths of the bias lines 64 and 66 are greatly narrower than those of the strip lines 71 to 73 of the branch transmission line 45. The current carrying areas of the bias lines 64 and 66 are greatly smaller than those of the strip lines 71 to 73. The bias lines 64 and 66 are grounded via the capacitors 68, 69, 78, and 79 at respective locations distant from the branch transmission line 45 by approximately a quarter wavelength ($\lambda/4$) of the microwave flowing through the high frequency switch device 33. Accordingly, high frequency impedances of the bias lines 64 and 66, viewed from the input terminal 41, become very high. Therefore, the bias lines 64 and 66 hardly affect the high frequency transmission in the corresponding branch transmission line 45.

Since the microwave outputted from the output terminal 42 is partially reflected by the emission antenna 16, there is concern that a high frequency potential may be increased in the branch transmission line 45. This means that there is concern that the reflected wave due to impedance mismatch with the emission antenna 16 may cause overvoltage in the branch transmission line 45. Thus, a high reverse voltage may be exerted on the ground side diode 65. In the present embodiment, a diode having a high reverse withstand voltage is employed as the ground side diode 65 so that the ground side diode 65 should not be damaged by the reverse voltage due to the reflected wave.

Figure 5:
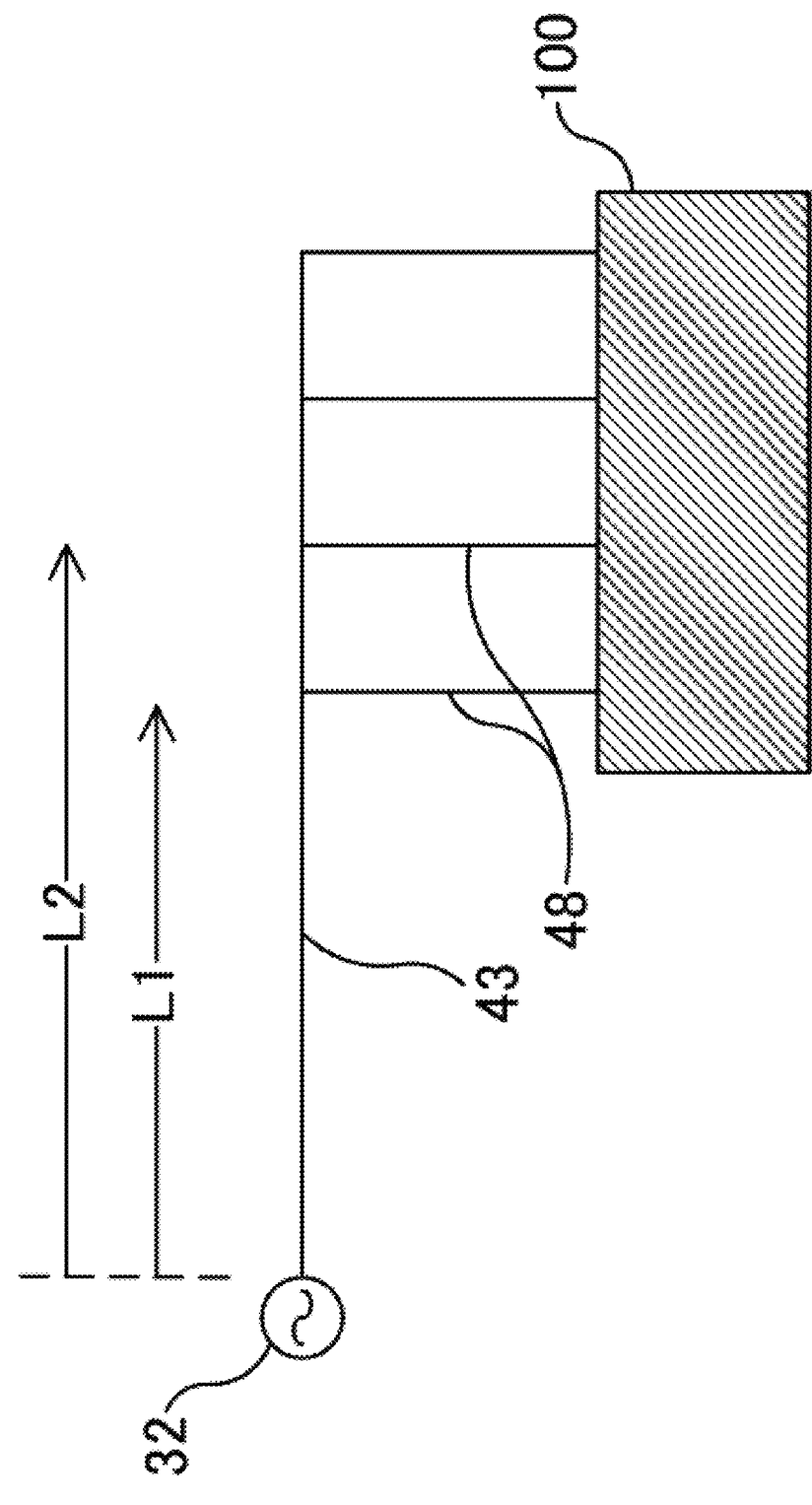
FIG. 5 is a circuit diagram illustrating adjustment of electrical length of an input side ground line according to the embodiment.

As shown in FIG. 5, the input side ground line 43 branches into the plurality of branch ground lines 48. Each branch ground line 48 is connected to the ground pattern 100. In FIG. 5, an effective length L1 is determined by the leftmost branch ground line 48 that constitutes a shortest electrical length between the ground pattern 100 and the electromagnetic wave oscillator 32. If it is required to make the effective length longer, the leftmost branch ground line 48 is removed. As a result of this, the effective length is determined to be L2 by the second leftmost branch ground line 48 that is next shortest in electrical length. The high frequency switch device 33 is easily adjustable in electrical length even in a state in which the printed circuit board is a finished product. Accordingly, it is possible to individually adjust the impedance of the high frequency switch device 33 in accordance with variation in circuit impedance caused by variation in assembly and constituent parts of the high frequency switch device 33. Therefore, it is possible to optimize the impedance matching while the high frequency switch device 33 in a state of use, being connected to the electromagnetic wave oscillator 32 and the emission antenna 16.

<Operation of High Frequency Switch Device>

Hereinafter, a description will be given of an operation (a switching operation) of the high frequency switch device 33. The high frequency switch device 33 performs the switching operation of switching the output terminal 42, from which high frequency is outputted, by controlling the switching parts 46 of the respective branch transmission lines 45. Each switching part 46 is controlled by the electronic control device 35 via the bias voltage output device 90 shown in FIG. 2.

Here, the bias voltage output device 90 is connected at an input side thereof to the electronic control device 35, and at an output side thereof to the first signal part 81 and the second signal input part 82 corresponding to the respective branch transmission lines 45 of the high frequency switch device 33. The bias voltage output device 90 is supplied with power from the direct current power supply 91 (such as a 12 V vehicle battery).

The bias voltage output device 90, upon receiving a switch signal from the electronic control device 35, outputs respective bias voltages to the transmission side diodes 63 and the ground side diodes 65 of the high frequency switch device 33. The bias voltage output device 90 outputs a positive bias voltage (such as +5 V bias voltage), which is stepped down from a voltage applied from the direct current power supply 91, to diodes to be applied with the forward bias, and outputs a negative bias voltage (such as −100 V bias voltage), which is boosted from the voltage applied from the direct current power supply 91, to diodes to be applied with the reverse bias.

For a branch transmission line 45a (the output side transmission line) corresponding to the output terminal 42, which outputs high frequency, the bias voltage output device 90 outputs the positive bias voltage to the first signal input part 81 of the transmission side bias line 64 of the output side transmission line 45a, and at the same time, outputs the negative bias voltage to the second signal input part 82 of the ground side bias line 66 of the output side transmission line 45a. On the other hand, for a branch transmission line 45b (the non-output side transmission line) corresponding to the output terminal 42, which does not output high frequency, the bias voltage output device 90 outputs the negative bias voltage to the first signal input part 81 of the transmission side bias line 64 of the non-output side transmission line 45b, and at the same time, outputs the positive bias voltage to the second signal input part 82 of the ground side bias line 66 of the non-output side transmission line 45*b*.

Then, in the output side transmission line 45*a*, the transmission side diode 63, which is applied with the forward bias, becomes electrically conductive, and the ground side diode 65, which is applied with the reverse bias, becomes electrically non-conductive (blocked). On the other hand, in the non-output side transmission line 45*b*, the transmission side diode 63, which is applied with the reverse bias, becomes electrically non-conductive (blocked), and the ground side diode 65, which is applied with the forward bias, becomes electrically conductive. As a result of this, viewed from the input terminal 41, the output side transmission line 45*a* enters into the conductive state, and the non-output side transmission lines 45*b* enter into the blocked states. The microwave inputted in the input terminal 41 is outputted from the output terminal 42 via the output side transmission line 45*a*.

Figure 6:
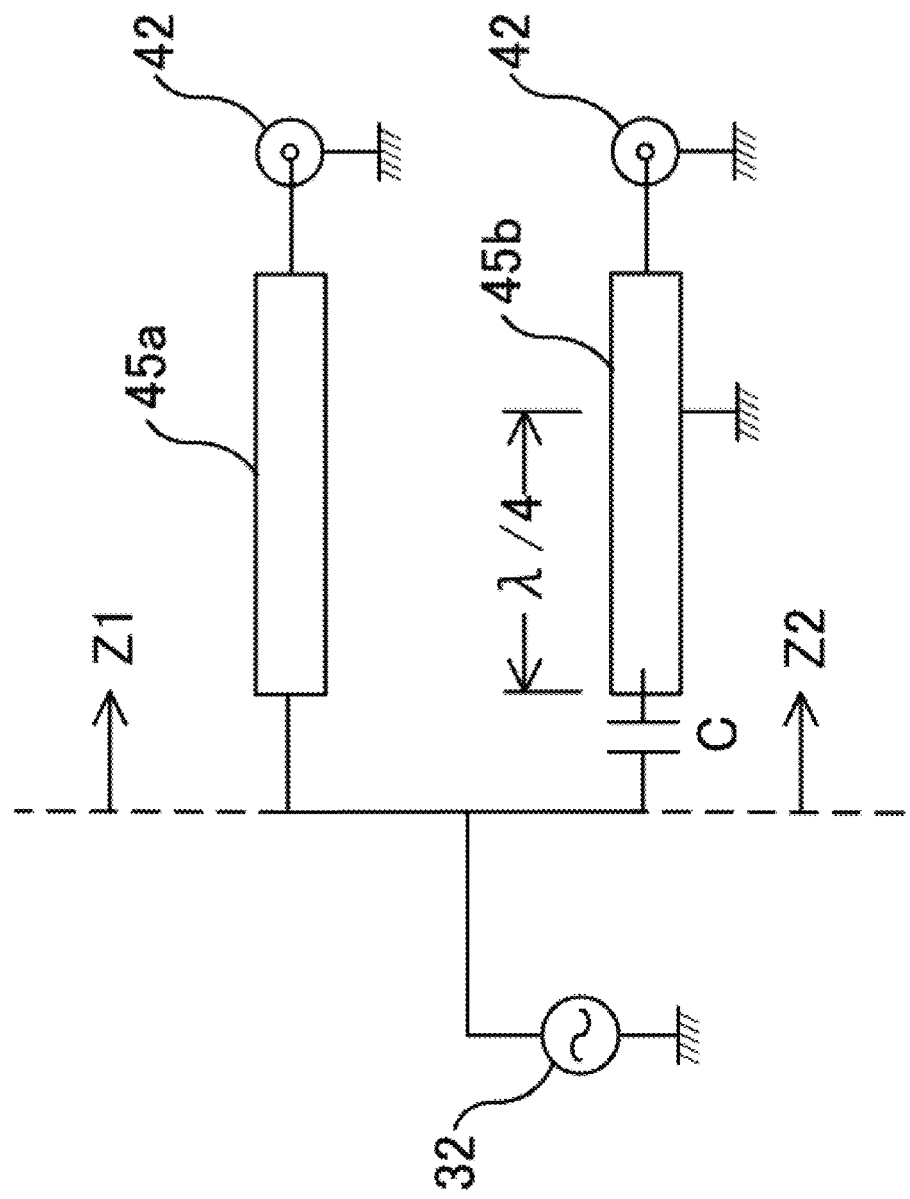
FIG. 6 is an equivalent circuit diagram in a case in which the high frequency switch device according to the embodiment is provided with two output terminals.

FIG. 6 shows an equivalent circuit of the high frequency switch device 33 while performing the switching operation in a case in which two output terminals 42 are provided. In FIG. 6, with respect to the electromagnetic wave oscillator 32, the output side transmission line 45*a* shown on an upper side is electrically conductive, and the non-output side transmission line 45*b* shown on a lower side is electrically blocked. The capacitor C of the non-output side transmission line 45*b* is a junction parasitic capacitance when the transmission side diode 63 is applied with the reverse bias.

In a case in which the ground side diode 65 is not provided, there is generally a possibility that high frequency may leak in the microwave region to some extent via the parasitic capacitance toward the side of the output terminal 42. In this case, high frequency may be outputted to some extent from the output terminal 42 of the non-output side transmission line 45*b* which is not supposed to output any high frequency.

In the present embodiment, the forward bias is applied to the ground side diode 65 of the non-output side transmission line 45*b* so that the side of the output terminal 42 apart from the parasitic capacitance in the non-output side transmission line 45*b* is grounded. More particularly, λ is defined as the wavelength of the microwave flowing through the high frequency switch device 33, the side of the output terminal 42 apart from the parasitic capacitance in the non-output side transmission line 45*b* is grounded at a location distant apart from the parasitic capacitance by λ/4. Therefore, in the non-output side transmission line 45*b*, the impedance Z2 of the side of the output terminal 42 viewed from the parasitic capacitance becomes approximately infinite. The non-output side transmission line 45*b* becomes equivalent to being disconnected from the electromagnetic wave oscillator 32, and is not allowed to affect the output side transmission line 45*a*. As a result of this, the impedance Z1 of the output side transmission line 45*a* alone constitutes impedance, viewed from the electromagnetic wave oscillator 32. Thus, it is possible to attain impedance matching, and approximately entire energy is transmitted to the output side transmission line 45*a*.

During the switching operation, the output terminal 42, which is required to output high frequency, is switched so that the high frequency is outputted from only one output terminal 42. Only one branch transmission line 45 constitutes the output side transmission line 45*a*, and the rest of the branch transmission lines 45 constitute the non-output side transmission lines 45*b*.

The electronic control device 35 outputs the switch signal so as to switch the output terminal 42, from which high frequency is outputted. The bias voltage output device 90, upon receiving the switch signal, outputs respective bias voltages to the switching parts 46 of the high frequency switch device 33 so that the microwave is exclusively supplied to the ignition plug 15 corresponding to the pulse generator 14 which the ignition signal is inputted to. More particularly, the bias voltage output device 90 outputs the bias voltages so that the branch transmission line 45, which is connected to the output terminal 42 corresponding to the ignition plug 15 which the high voltage pulse is applied to, becomes the output side transmission line 45*a*, and that the branch transmission lines 45, which are connected to the output terminals 42 corresponding to the ignition plugs 15 which the high voltage pulse is not applied to, become the non-output side transmission lines 45*b*.

<Operation of Plasma Generation Device>

Hereinafter, a description will be given of an operation of the plasma generation device 30 in connection with an operation of the engine main body 11.

The engine 10 performs a plasma ignition operation of igniting fuel air mixture in the combustion chamber 20 by way of the microwave plasma generated by the plasma generation device 30. The plurality of combustion chambers 20 are shifted in the ignition timing from one another.

In each cylinder 24, immediately before the piston 23 reaches the top dead center, the intake valve 27 is opened, and the intake stroke starts. Immediately after the piston 23 passes the top dead center, the exhaust valve 28 is closed, and the exhaust stroke ends. The electronic control device 35 outputs an injection signal to the injector 29 corresponding to the cylinder 24 during the intake stroke, thereby causing the injector 29 to inject fuel.

Subsequently, immediately after the piston 23 passes the bottom dead center, the intake valve 27 is closed, and the intake stroke ends. After the intake stroke ends, the compression stroke starts. Immediately before the piston 23 reaches the top dead center, the electronic control device 35 outputs the ignition signal to the pulse generator 14 corresponding to the cylinder 24 during the compression stroke. Then, the high voltage pulse outputted from the pulse generator 14 is supplied to the ignition plug 15. As a result of this, the discharge plasma is generated at the discharge gap of the ignition plug 15.

Furthermore, the electronic control device 35 outputs the electromagnetic wave drive signal to the power supply for electromagnetic wave 31 immediately before the high voltage pulse is outputted from the pulse generator 14 corresponding to each cylinder 24. Prior to the output of the electromagnetic wave drive signal, the high frequency switch device 33 has already performed the switching operation so that the supply destination of the microwave is set to the ignition plug 15 corresponding to the pulse generator 14 which the ignition signal is inputted to.

As a result of this, the pulse current is outputted from the power supply for electromagnetic wave 31 to the electromagnetic wave oscillator 32, and the microwave pulse is outputted from the electromagnetic wave oscillator 32. The microwave pulse is emitted from the emission antenna 16 to the combustion chamber 20. The microwave pulse is continuously emitted during a period starting from immediately before discharge plasma is generated until immediately after the discharge plasma is generated. At a timing when the discharge plasma is generated, a strong electric field region (a region having an electric field relatively strong in intensity in the combustion chamber 20) is formed due to the microwave pulse in the vicinity of a tip end of the central electrode 16. The discharge plasma absorbs the microwave energy and expands and becomes relatively large microwave plasma. In the combustion chamber 20, the fuel air mixture is volume ignited by the microwave plasma, and the fuel air mixture starts to combust.

A start timing of the microwave pulse emission from the emission antenna 16 may be after the discharge plasma is generated as long as the microwave pulse is emitted before the discharge plasma disappears.

In the cylinder 24, the piston 23 is moved toward the bottom dead center by the expansion force of the combustion of the fuel air mixture. Immediately before the piston 23 reaches the bottom dead center, the exhaust valve 28 is opened, and the exhaust stroke starts. As described above, the exhaust stroke ends immediately after the intake stroke starts.

Effect of Embodiment

In the present embodiment, since the ground side diode 65 of the non-output side transmission line 45b is made conductive so as to increase the impedance of the side of the output terminal 42 viewed from the parasitic capacitance in the non-output side transmission line 45b, the high frequency outputted from the output terminal 42 of the non-output side transmission line 45b is reduced. Accordingly, even if diodes are employed to perform the switching of the output terminal 42, from which high frequency is outputted, at high speed, it is possible to transmit large amount of high frequency energy to the output terminal 42 of the output side transmission line 45a.

Furthermore, in the present embodiment, the distance between the transmission side diode 63 and the grounding point is optimized so that the non-output side transmission line 45b should not affect the output side transmission line 45a. This means that the impedance viewed from the input terminal 41 is made equal to the impedance of the output side transmission line 45a alone. This leads to the fact that it is possible to attain impedance matching with ease. Accordingly, it is possible to further increase the amount of high frequency energy to be supplied to the output terminal 42, from which high frequency is outputted, and thus, it is also possible to further decrease the loss caused by the switching of the output terminal 42, from which high frequency is outputted.

Furthermore, in the present embodiment, the current carrying areas of the transmission side bias line 64 and the ground side bias line 66 are configured small in comparison with the branch transmission line 45 so that the high frequency impedances of the bias lines 64 and 66 viewed from the input terminal 41 should be made high. Accordingly, the influences of the bias lines 64 and 66 on the high frequency transmission are decreased in the branch transmission line 45, and it is also possible to further decrease the loss caused by the switching of the output terminal 42, from which high frequency is outputted.

Furthermore, in the present embodiment, the bias lines 64 and 66 are grounded at respective locations distant from the branch transmission line 45 by approximately $(2n+1) \times \lambda/4$ so that the high frequency impedances of the bias lines 64 and 66 should be made high. Accordingly, it is possible to decrease the influences of the bias lines 64 and 66 on the high frequency transmission in the branch transmission line 45, and it is possible to further decrease the loss caused by the switching of the output terminal 42, from which high frequency is outputted.

Furthermore, in the present embodiment, the plurality of ground side diodes 65 are connected in series, thereby increasing the reverse withstand voltage of the ground side diodes 65. Accordingly, it is possible to prevent the ground side diodes 65 from being damaged by the reflection of high frequency due to impedance mismatch.

Furthermore, in the present embodiment, the input side ground line 43 is provided with the plurality of branch ground lines 48 different in electrical length from one another, thereby enabling to adjust the electrical length of the input side ground line 43 even after the high frequency switch device 33 is completed. Accordingly, it is possible to individually adjust the impedance of the high frequency switch device 33 in accordance with variation in circuit impedance due to variation in assembly and constituent parts of the high frequency switch device 33. Therefore, it is possible to optimize the impedance matching while the high frequency switch device 33 in a state of use, being connected to the electromagnetic wave oscillator 32 and the emission antenna 16.

Furthermore, in the present embodiment, since the voltage applied from the direct current power supply 91 is stepped down or boosted so as to be outputted as the bias voltages according to the application direction of the bias voltage, it is possible to suitably control the diodes 63 and 65.

Other Embodiments

The embodiment described above may also be configured as follows.

In the embodiment described above, the discharge device 12 may be omitted and the plasma generation device 30 may generate the microwave plasma by means of the electromagnetic emission device 13 alone. In this case, although a peak power required for generating the microwave plasma increases, it is possible to simplify the device configuration. In place of the discharge device 12, a glow plug for emitting thermal electrons may be employed. In this case, the thermal electrons are accelerated by the microwave energy, and the microwave plasma is generated.

Furthermore, in the embodiment described above, although the central electrode 16 supplied with the high voltage pulse has been employed as the emission antenna 16, the emission antenna 16 may be provided separately from the central electrode 16. The emission antenna 16 may be provided, for example, through the ignition plug 15 or on the cylinder head 22.

Furthermore, in the embodiment described above, a plurality of emission antennae 16 may be provided for each combustion chamber 20. In the combustion chamber 20, microwaves are emitted at different timings from respective emission antennae 16. In the vicinities of the plurality of emission antennae 16, respective pieces of the microwave plasma are generated at different timings.

INDUSTRIAL APPLICABILITY

The present invention is useful in relation to a high frequency switch device that switches an output terminal, from which high frequency is outputted, from among a plurality of output terminals, and a bias voltage output device that outputs bias voltages to diodes of the high frequency switch device.

EXPLANATION OF REFERENCE NUMERALS

33 High Frequency Switch Device
41 Input Terminal
42 Output Terminal
45 Branch Transmission Line
46 Switching Part (Switching Unit)
51 First Capacitor 52 Second Capacitor
63 Transmission Side Diode
65 Ground Side Diode

What is claimed is:

1. A high frequency switch device comprising:
an input terminal that inputs a high frequency from outside;
a plurality of output terminals that output, to outside, the high frequency inputted to the input terminal;
a plurality of branch transmission lines that are respectively provided to the output terminals and are each adapted to transmit, to the corresponding output terminal, the high frequency inputted to the input terminal; and
a plurality of switching units that are respectively provided to the branch transmission lines, each of the switching units is adapted to switch between an ON state which allows a high frequency to flow through the corresponding branch transmission line, and an OFF state which does not allow a high frequency to flow through the corresponding branch transmission line,
wherein the high frequency switch device controls the switching units so as to switch the output terminal, from which high frequency is outputted,
each switching unit includes a transmission side diode that is provided in the branch transmission line in such a manner that a cathode thereof is arranged on a side of the input terminal and an anode thereof is arranged on a side of the output terminal, and a ground side diode that is provided in such a manner that a cathode thereof is grounded and an anode thereof is electrically connected between the output terminal and the transmission side diode in the branch transmission line,
each branch transmission line includes a first capacitor and a second capacitor on the side of the output terminal from the transmission side diode in such a manner that the anode of the ground side diode is connected between the first capacitor and the second capacitor, and
the high frequency switch device further comprises an input side ground line for grounding the input terminal, and the input side ground line branches into a plurality of branch ground lines which are different in electrical length from one another and are respectively grounded.

2. The high frequency switch device according to claim 1, in which
the cathode of the ground side diode is grounded at a location distant from the transmission side diode by approximately $(2n+1)\times\lambda/4$
wherein $\lambda$ is defined as a wavelength of the high frequency flowing through the high frequency switching device and n is defined as a non-negative integer.

3. The high frequency switch device according to claim 1, wherein there are provided a transmission side bias line for applying a bias voltage to the transmission side diode and a ground side bias line for applying a bias voltage to the ground side diode, and
the current carrying areas of the transmission side bias line and the ground side bias line are small in comparison with the branch transmission line.

4. The high frequency switch device according to claim 3, wherein the transmission side bias line and the ground side bias line are each grounded at a location distant from the branch transmission line by approximately $(2n+1)\times\lambda/4$ wherein $\lambda$ is defined as a wavelength of the high frequency flowing through the high frequency switching device and n is defined as a non-negative integer.

5. The high frequency switch device according to claim 1, wherein each branch transmission line is provided with a plurality of the ground side diodes, which are connected in series between the branch transmission line and a ground conductor which the cathode of one of the ground side diodes is connected to.

6. A bias voltage output device that outputs bias voltages respectively to the transmission side diodes and the ground side diodes of the high frequency switch device according to claim 1,
wherein the bias voltage output device is connected to a power supply and adapted selectively to step down a voltage applied from the power supply and output the voltage thus stepped down to diodes that are to be applied with the forward bias from among the transmission diodes and the ground side diodes, and to boost the voltage applied from the power supply and output the voltage thus boosted as a bias voltage to diodes that are to be applied with the reverse bias from among the transmission diodes and the ground side diodes.

* * * * *